United States Patent
Cai et al.

(10) Patent No.: US 9,673,233 B2
(45) Date of Patent: Jun. 6, 2017

(54) ARRAY SUBSTRATE, DISPLAY PANEL AND METHOD FOR MANUFACTURING ARRAY SUBSTRATE

(71) Applicants: BOE Technology Group Co., Ltd., Beijing (CN); Hefei Xinsheng Optoelectronics Technology Co., Ltd., Anhui (CN)

(72) Inventors: Zhenfei Cai, Beijing (CN); Juan Fang, Beijing (CN); Xiaomei Wei, Beijing (CN); Min Chen, Beijing (CN)

(73) Assignees: BOE Technology Group Co., Ltd., Beijing (CN); Hefei Xinsheng Optoelectronics Technology Co., Ltd., Anhui (CN)

( * ) Notice: Subject to any disclaimer, the term of this patent is extended or adjusted under 35 U.S.C. 154(b) by 0 days.

(21) Appl. No.: 15/163,805

(22) Filed: May 25, 2016

(65) Prior Publication Data
US 2016/0358947 A1    Dec. 8, 2016

(30) Foreign Application Priority Data
Jun. 5, 2015  (CN) .......................... 2015 1 0309392

(51) Int. Cl.
| | | |
|---|---|---|
| H01L 29/04 | (2006.01) | |
| H01L 27/14 | (2006.01) | |
| H01L 29/15 | (2006.01) | |
| H01L 31/036 | (2006.01) | |
| H01L 27/12 | (2006.01) | |
| G02F 1/1362 | (2006.01) | |
| G02F 1/1333 | (2006.01) | |
| G02F 1/1343 | (2006.01) | |

(52) U.S. Cl.
CPC ...... *H01L 27/1244* (2013.01); *G02F 1/13439* (2013.01); *G02F 1/133345* (2013.01); *G02F 1/136227* (2013.01); *G02F 1/136286* (2013.01); *H01L 27/1288* (2013.01); *G02F 2001/136295* (2013.01)

(58) Field of Classification Search
CPC ............. H01L 27/1244; H01L 27/1288; G02F 1/136227; G02F 1/136286; G02F 1/133345; G02F 1/13439; G02F 2001/136295
See application file for complete search history.

(56) References Cited

U.S. PATENT DOCUMENTS

| | | | | |
|---|---|---|---|---|
| 5,841,490 A | * | 11/1998 | Matsuo ............... | H01L 27/1214 257/E27.111 |
| 2008/0079859 A1 | * | 4/2008 | Ota ................... | G02F 1/136204 349/40 |
| 2016/0027372 A1 | * | 1/2016 | Yan ................... | G02F 1/136204 345/211 |

* cited by examiner

*Primary Examiner* — Victor A Mandala
(74) *Attorney, Agent, or Firm* — Banner & Witcoff, Ltd.

(57) ABSTRACT

An array substrate is disclosed, which includes a connection structure of a second short-circuit ring and one corresponding data line, and this connection structure includes: a first electrode disposed on a base substrate; a connection line disposed on the first electrode; a first insulating layer disposed on the first electrode and the connection line, in which the data line connected with the second short-circuit ring is disposed on the first insulating layer; a second insulating layer disposed on the data line connected with the second short-circuit ring; and a second electrode disposed on the second insulating layer, in which the second electrode is connected with the data line connected with the second short-circuit ring through a first via hole and connected with the first electrode through a second via hole.

20 Claims, 5 Drawing Sheets

ARRAY SUBSTRATE, DISPLAY PANEL AND METHOD FOR MANUFACTURING ARRAY SUBSTRATE

This application claims priority to and the benefit of Chinese Patent Application No. 201510309392.4 filed on Jun. 5, 2015, which application is incorporated herein in its entirety.

TECHNICAL FIELD

Embodiments of the present disclosure pertain to an array substrate, a display panel, and a method for manufacturing an array substrate.

BACKGROUND

As flat-panel display devices, thin-film transistor liquid crystal display (TFT-LCDs) have dominated the current market of flat-panel displays due to the characteristics of small volume, low power consumption, relatively low manufacturing cost, non-radiation, etc.

Currently, the display modes of the TFT-LCD mainly include twisted nematic (TN) mode, vertical alignment (VA) mode, in-plane-switching (IPS) mode and advanced super dimension switch (ADSDS or ADS) mode.

SUMMARY

An embodiment of the present disclosure provides an array substrate, comprising: a group of data lines and a group of gate lines which are intercrossed with each other; and a first short-circuit ring and a second short-circuit ring which are disposed along a peripheral area of the array substrate. Two adjacent data lines in the group of data lines are respectively connected with the first short-circuit ring and the second short-circuit ring; and a connection structure between the second short-circuit ring and one corresponding data line includes: a first electrode disposed on a base substrate; a connection line disposed on the first electrode; a first insulating layer disposed on the first electrode and the connection line, in which the data line connected with the second short-circuit ring is disposed on the first insulating layer; a second insulating layer disposed on the data line connected with the second short-circuit ring, in which the second insulating layer is provided with a first via hole on the data line connected with the second short-circuit ring, and the first insulating layer and the second insulating layer are provided with a second via hole on the first electrode; and a second electrode disposed on the second insulating layer, in which the second electrode is connected with the data line connected with the second short-circuit ring through the first via hole and connected with the first electrode through the second via hole.

Another embodiment of the present disclosure provides a display panel, comprising the above array substrate.

Still another embodiment of the present disclosure provides a method for manufacturing an array substrate, comprising: forming data lines and a first short-circuit ring on a base substrate, in which the data lines in odd numbered sequence or the data lines in even numbered sequence are connected with the first short-circuit ring; forming a first electrode, a connection line and a second short-circuit ring on the base substrate, in which the connection line is disposed on the first electrode and connected with the second short-circuit ring and the first electrode; forming a first insulating layer on a layer structure of the connection line and the second short-circuit ring, in which the data lines and the first short-circuit ring are formed on the first insulating layer; forming a second insulating layer on a layer structure of the data lines and the first short-circuit ring, in which the second insulating layer is provided with a first via hole on the data line not connected with the first short-circuit ring, and the first insulating layer and the second insulating layer are provided with a second via hole on the first electrode; and forming a second electrode on the second insulating layer, in which the second electrode is connected with one corresponding data line through the first via hole and connected with the first electrode through the second via hole.

Further still another embodiment provides an array substrate, comprising: a group of data lines; and a first short-circuit ring and a second short-circuit ring which are disposed along a peripheral area of the array substrate. In the group of data lines, the first data line in two adjacent data lines is connected with the first short-circuit ring, and the second data line in the two adjacent data lines is connected with the second short-circuit ring; and a connection structure of the second short-circuit ring and the second data line includes: a first electrode disposed on a base substrate; a first part to be connected disposed on the first electrode and connected with the first electrode; a first insulating layer disposed on the first electrode and the first part to be connected; and a second part to be connected disposed on the first insulating layer, in which the second part to be connected is connected with the first electrode via a via hole in the first insulating layer, and one of the first part to be connected and the second part to be connected is the second short-circuit ring and the other is the second data line.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
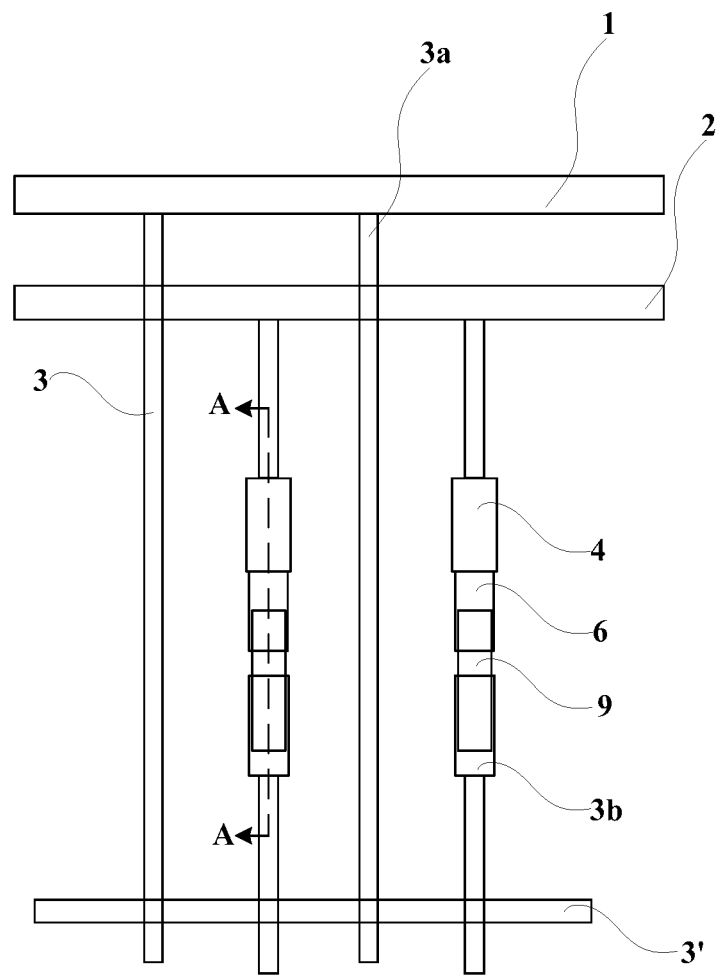
FIG. 1 is a schematic structural top view of a peripheral area of an array substrate provided by the embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The ADS mode has developed to form an array substrate by means of four patterning processes, in which for example a first transparent electrode layer and a gate metal layer both are formed by one photolithographic process. For example, firstly, a first transparent conductive film and a gate metal film are deposited in order on a substrate; secondly, photoresist is coated on the stacked films, and a grey tone exposure process and a development process are performed; and thirdly, a wet etching process and a dry etching process are performed. Thus, two layers of conductive material are formed on the substrate by one photolithographic process, and hence the cost can be greatly reduced.

In order to detect the defects in the process of manufacturing the array substrate, in the array substrate, two short-circuit rings (a first short-circuit ring and a second short-circuit ring respectively) are disposed along the peripheral area of the array substrate. The first short-circuit ring is arranged in the same layer as source/drain electrodes, made from a data metal film for forming data lines, and connected with data lines in odd numbered sequence. The second short-circuit ring is arranged in the same layer as gate electrodes, made from a gate metal film for forming the gate electrodes, and connected with data lines in even numbered sequence by way of via holes.

In the process of manufacturing the array substrate in which copper is used as the gate metal for forming a gate layer, because copper has the characteristics of high activity and high oxidability, in the process of forming a first insulating layer on the gate metal film, a high temperature of more than 300 DEG C. is usually required and the copper surface is oxidizable after the temperature is raised. After the deposition of a passivation layer (that is, a second insulating layer) on the first insulating layer, high-power plasma will be adopted for conducting dry etching, so that the surface of the copper film (gate metal film) can be further bombarded. Moreover, a high-temperature annealing process is required in the manufacturing process in the state that the gate metal makes contact with the transparent electrodes. Due to the high-temperature annealing, the gate metal at the edge of the via hole is oxidized and corroded, and hence signal fault can be produced.

In order to improve the reliability of signal transduction at the via holes for connection to the short-circuit rings on the array substrate, the embodiment of the present disclosure provides an array substrate, a display panel and a method for manufacturing the array substrate. Further detailed description will be given below to the embodiment of the present disclosure.

Figure 2:
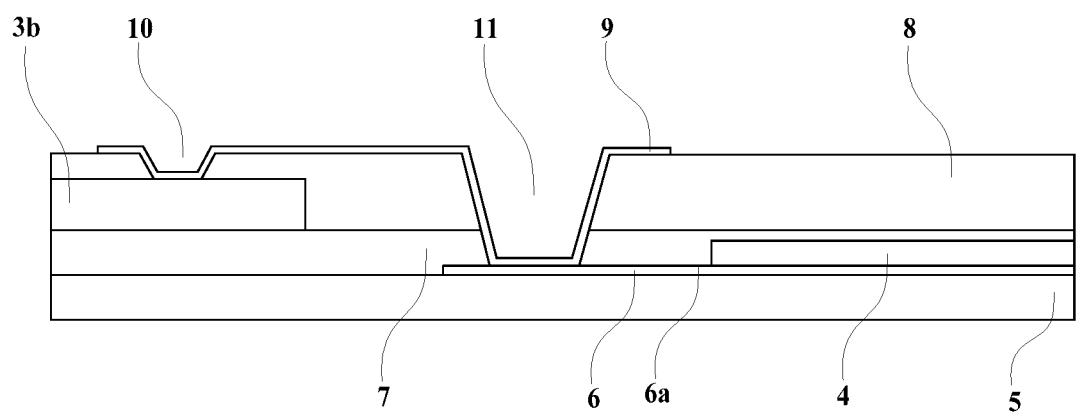
FIG. 2 is a schematic structural sectional view of FIG. 1 in the A-A direction.

As illustrated in FIGS. 1 and 2, the array substrate provided by an embodiment of the present disclosure comprises a group of data lines 3 and a group of gate lines 30 (only one gate line is shown in FIG. 1 for the purpose of illustration), and the data lines and the gate lines are intercrossed with each other in different directions, and a first short-circuit ring 1 and a second short-circuit ring 2 which are disposed along a peripheral area of the array substrate. In the group of data lines 3, two adjacent data lines 3*a* and 3*b* are respectively connected with the first short-circuit ring 1 and the second short-circuit ring 2, as illustrated in the drawings. The array substrate include a display area (including a pixel array) and a non-display area surrounding the display area, and the first short-circuit ring 1 and the second short-circuit ring 2 are provided in the non-display area.

A connection structure between the second short-circuit ring 2 and the data line 3*b* includes: a first electrode 6 (e.g., first transparent electrode) disposed on base substrate 5; a connection line 4 (e.g., a gate connection line on the same layer as a gate electrode) disposed on the first electrode 6 and connected with both the first electrode 6 and the second short-circuit ring 2; a first insulating layer 7 disposed on the first electrode 6 and the connection line 4; the data line 3*b* disposed on the first insulating layer 7; a second insulating layer 8 disposed on the data line 3*b*; and a second electrode 9 (e.g., a second transparent electrode) disposed on the second insulating layer 8. The second insulating layer 8 is provided with a first via hole 10 on the data line 3*b* and exposing the data line 3*b*, and the first insulating layer 7 and the second insulating layer 8 are provided with a second via hole 11 on the first electrode 6 and exposing the first electrode 6, and the second electrode 9 is connected with the data line 3*b* via the first via hole 10 and connected with the first electrode 6 via the second via hole 11.

It should be noted that: as for the connection between the connection line 4 and the second short-circuit ring 2, the connection line 4 may be integrated as a part of the second short-circuit ring 2, and also may be a structure separated from the second short-circuit ring 2 but connected to the second short-circuit ring by means of an intermediate component. For instance, the connection line 4 and the second short-circuit ring 2 may be arranged in the same layer (namely formed by the same conductive film).

For instance, the connection line 4 may be lapped over an upper surface 6*a* of the first electrode 6. That is to say, in the direction perpendicular to a base substrate 5, no insulating layer is disposed between the connection line 4 and the upper surface 6*a* of the first electrode 6, so the connection line 4 is directly formed on the upper surface 6*a* of the first electrode 6 and electrically connected thereto. In this way, the contact area between the first electrode 6 and the connection line 4 can be increased and become bigger, and accordingly the electrical connection therebetween become more reliable.

For instance, the first short-circuit ring 1 and the group of data lines 3 may be arranged in the same layer; and/or the second short-circuit ring 2 and the group of gate lines 30 may be arranged in the same layer. In this case, for instance, the connection lines 4, the second short-circuit ring 2 and the gate lines 30 may be arranged in the same layer. Of course, the first short-circuit ring 1 and the data lines 3 may also be arranged in different layers. For instance, the first short-circuit ring 1 may be arranged in the same layer as the gate lines 30 (e.g., the first short-circuit ring 1 is connected with the gate line 30 through the connection structure) or other conductive structures. The second short-circuit ring 2 may also be arranged in different layers from the gate lines 30. For instance, when thin-film transistors (TFTs) of sub-pixels in the array substrate adopt a top-gate structure, the array substrate may further comprise a shielding metal structure disposed beneath a semiconductor layer of the TFT. In this case, the second short-circuit ring 2 may be arranged in the same layer as the shielding metal structure. The embodiment of the present disclosure includes, but not limited to, the examples.

For instance, the first electrode 6 may be a first transparent electrode; and/or the second electrode 9 may be a second transparent electrode. Of course, the first electrode 6 may also be opaque, i.e., not transparent. For instance, when the shielding metal structure is made from a material which cannot be easily oxidized due to high temperature and cannot be easily eroded due to plasma bombardment, the first electrode 6 may be arranged in the same layer as the shielding metal structure. The second electrode 9 may also be opaque. For instance, when the TFTs of the sub-pixels of the array substrate adopt a top-gate structure, the second electrode may be arranged in the same layer as gate electrodes of the TFTs. As the gate electrodes are usually made from an opaque metallic material, the second electrode is correspondingly opaque. The embodiment of the present disclosure includes, but not limited to, the examples, as long as the first electrode 6 is made from a material which cannot be easily oxidized due to high temperature and cannot be easily eroded due to plasma bombardment.

For instance, the connection line 4 may be a gate connection line, namely a connection line arranged in the same layer as the gate line 30 (as well as the gate electrodes of the TFTs in the sub-pixels). Of course, the connection line 4 may also be arranged in the same layer as other structures (e.g., the shielding metal structure).

In the embodiment of the present disclosure, the first electrode 6 is taken as an interconnection structure for connecting the connection line 4 and the second electrode 9, and therefore poor contact of signal lines at the via holes with a short-circuit ring on the array substrate can be notably alleviated. The reasons are as follows: as the connection line 4 is disposed on the first electrode 6, the contact area between them becomes large, so that the conductive connection becomes more reliable; as the second via hole 11 is led to the first electrode 6 (e.g., the first transparent electrode) but not led to the connection line 4, and the first electrode 6 is exposed and the connection line 4 is sheltered by the second via hole 11. Therefore in the process of forming the second via hole 11 by way of large-power plasma for dry etching, the structure can reduce or avoid the erosion on the surface of the connection line 4; and as the second electrode 9 is connected with the first electrode 6 (e.g., the first transparent electrode) via the second via hole 11 and not directly connected with the connection line 4, in the process of manufacturing the array substrate, metal at the via holes is not oxidizable, so that the reliability of signal transduction at the via holes for connecting a short-circuit ring on the array substrate can be greatly improved.

As illustrated in FIG. 1, the first short-circuit ring 1 is connected with the data line 3*a* in odd numbered sequence, and the second short-circuit ring 2 is connected with the data line 3*b* in even numbered sequence. In other embodiments of the present disclosure, the first short-circuit ring 1 may be connected with a data line in even numbered sequence, and the second short-circuit ring 2 may be connected with a data line in odd numbered sequence.

In the embodiment of the present disclosure, different voltages are applied to signal input terminals of the first short-circuit ring 1 and the second short-circuit ring 2 respectively, so that whether the display area of the array substrate suffers from poor line defect, e.g., short-circuit detect and disconnection defect, can be detected. In the case of disconnection defect, the voltage signal after a disconnection position can be obviously reduced, and a detection device can sense voltage change via a test probe and hence can detect the disconnection defect. In the case of short-circuit defect, as voltage signals applied to two adjacent data lines are different, but if short circuit occurs between two adjacent data lines, the voltage signals of the two adjacent data lines are affected, and the detection device can sense a short-circuit point via the test probe and hence detect the short-circuit defect.

Figure 3A:
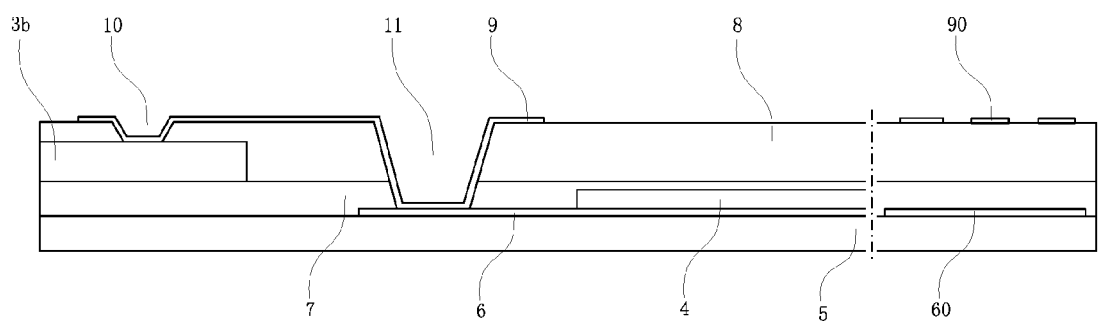
FIG. 3*a* is a schematic structural view of a peripheral area and a plate electrode and slit electrodes of a display area in the array substrate provided by the embodiment of the present disclosure.

In the embodiment of the present disclosure, the array substrate may be an ADS mode array substrate. The ADS mode display panel has the advantages of high resolution, high transmittance, low power consumption, wide viewing angle, high aperture ratio, low color difference and non push Mura. When the array substrate is an ADS mode array substrate, for instance, as illustrated in FIG. 3*a* which is a schematic structural view of a peripheral area as well as a plate electrode and a slit electrode of a display area in the array substrate provided by the embodiment of the present disclosure, the array substrate may comprise a plate electrode 60 and a slit electrode 90 in each a sub-pixel. The first electrode 6 is arranged in the same layer as the plate electrode 60 and the second electrode 9 is arranged in the same layer as the slit electrodes 90. Thus, the manufacturing cost of the array substrate can be reduced. In this case, as the plate electrode and the slit electrodes of the array substrate are usually transparent, the first electrode and the second electrode are also both transparent, namely being the first transparent electrode and the second transparent electrode respectively.

It should be noted that the type of the array substrate is not limited to the ADS mode array substrate in the embodiments of the present disclosure. For instance, the array substrate may also be a TN mode array substrate, a VA mode array substrate, etc.

Figure 3B:
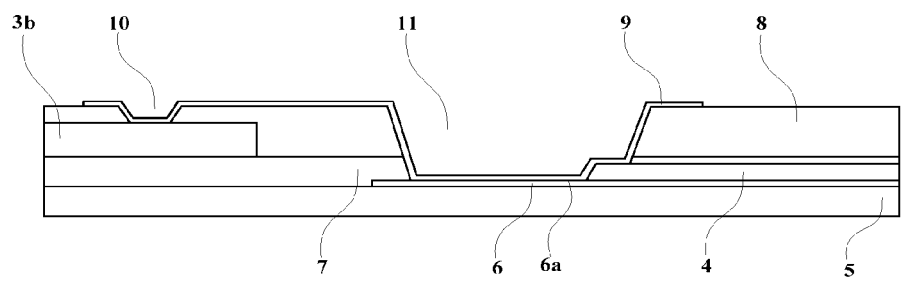
FIG. 3*b* is a schematic structural view of the array substrate provided by the embodiment of the present disclosure.

For instance, as illustrated in FIG. 3*b*, the second via hole 11 passing through the first insulation layer 7 and the second insulation layer 8 can further expose a part of the surface of the connection line 4, that is, the bottom opening of the second via hole 11 is opposite to the corresponding connection line 4. In this way, the second electrode 9 directly contacts not only the partial surface 6*a* of the first electrode 6 but also the partial surface of the connection line 4. In the case where the first electrode 6 is a transparent electrode and the connection line 4 is made of a metal material, the direct connection between the second electrode 9 and the first electrode 6 as well as the connection line 4 provide the reliability of signal transduction at the second via hole 11 and further reduce the electrical resistance at the second via hole 11.

For instance, the second short-circuit ring 2 may be made from copper or copper alloy. For instance, when the second short-circuit ring 2 is arranged in the same layer as the gate lines, the material of the gate lines may also include copper or copper alloy correspondingly. In this case, by adoption of the array substrate provided by the embodiment of the present disclosure, an opening or via hole will not be directly formed in an insulating layer on the second short-circuit ring 2 to expose the second short-circuit ring 2, so that the copper metallic materials of the second short-circuit ring 2 cannot be oxidized due to high temperature or eroded due to plasma bombardment. Of course, when the material of the second short-circuit ring 2 includes the material which can be easily oxidized or be eroded due to plasma bombardment beside copper, the array substrate provided by the embodiment of the present disclosure may also be adopted.

The embodiment of the present disclosure further provides a display panel, which comprises the array substrate provided by any foregoing embodiment. Due to reliable contact of signal lines at the via holes for connecting a short-circuit ring on the array substrate of the display panel, signal transduction is reliable.

Figure 4:
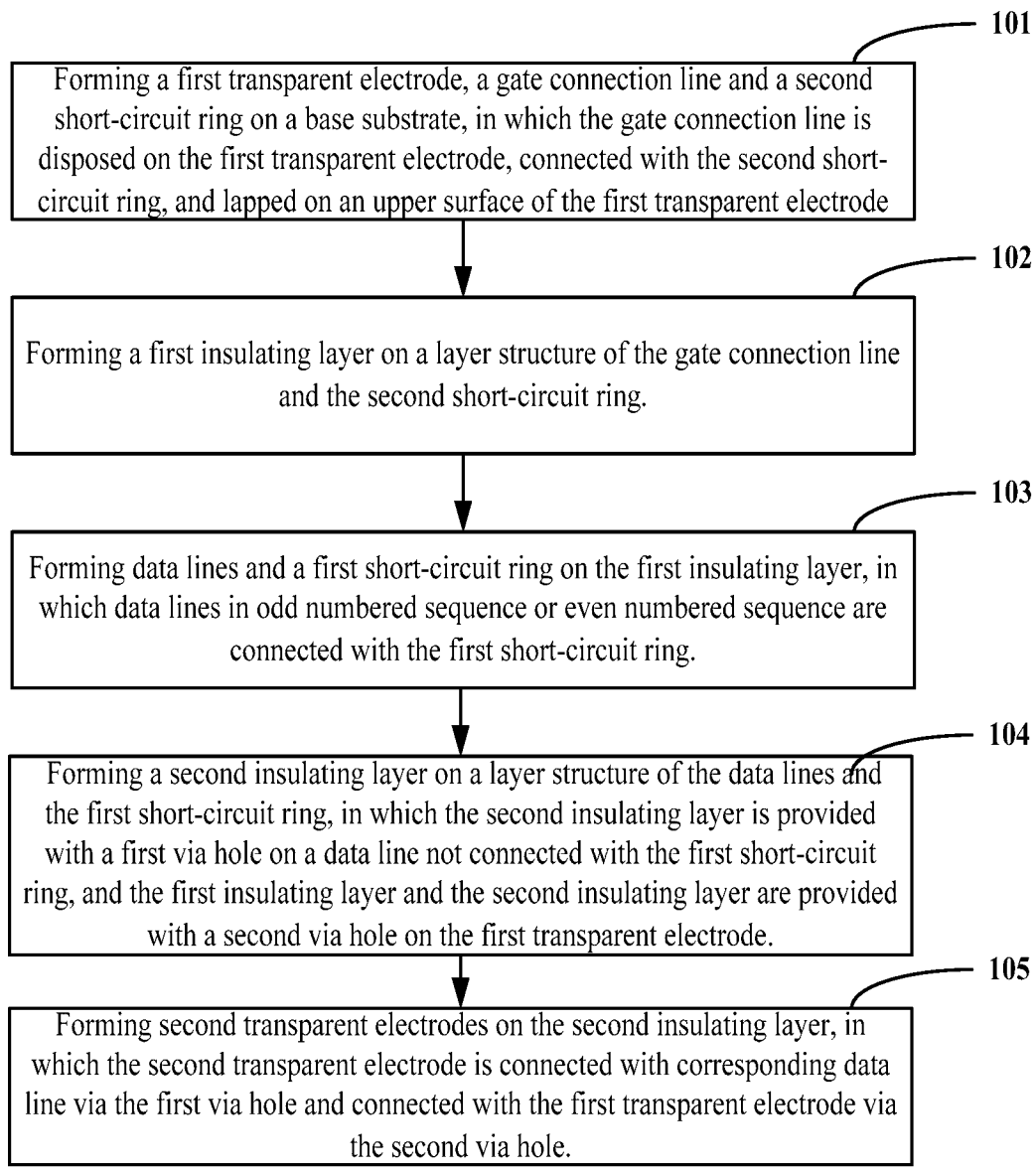
FIG. 4 is a flowchart of a method for manufacturing an array substrate, provided by the embodiment of the present disclosure.

As illustrated in FIG. 4, the embodiment of the present disclosure further provides a method for manufacturing an array substrate, which comprises the processes of forming first electrodes, second electrodes, a first short-circuit ring, a second short-circuit ring, data lines, gate lines, gate connection lines, a first insulating layer and a second insulating layer. Description will be given below with reference to the processes S101 to S105.

S101: forming a first electrode (e.g., first transparent electrodes as shown in FIG. 4), a connection line (e.g., gate connection lines as shown in FIG. 4) and a second short-circuit ring on a base substrate, in which the connection line is disposed on the first electrode and connected with the second short-circuit ring and the first electrode. For instance, as illustrated in FIG. 4, the connection line may be lapped over an upper surface of the first electrode. Of course, the gate connection line may also be connected with the first electrode through a via hole in an insulating layer or connected with the first electrode by other means.

S102: forming a first insulating layer on a layer structure of the connection line and the second short-circuit ring.

It should be noted that the layer structure of the connection line and the second short-circuit ring may be a single-layer structure. In this case, the connection line and the second short-circuit ring are arranged in the same layer. Or the layer structure of the connection line and the second short-circuit ring may also be of a multi-layer structure. In this case, the connection lines and the second short-circuit ring may be arranged in different layers.

S103: forming data lines and a first short-circuit ring on the first insulating layer, in which data lines in odd numbered sequence or even numbered sequence are connected with the first short-circuit ring. For instance, in the step, source electrodes and drain electrodes of TFTs of the array substrate may also be formed at the same time when the data lines are formed and made of the same conductive material.

S104: forming a second insulating layer on a layer structure of the data lines and the first short-circuit ring, in which the second insulating layer is provided therein with a first via hole over a data line not connected with the first short-circuit ring and thus expose this data line, and the first insulating layer and the second insulating layer are provided with a second via hole over the first electrode and thus expose this first electrode.

It should be noted that the layer structure of the data lines and the first short-circuit ring may be of a single-layer structure. In this case, the data lines and the first short-circuit ring may be arranged in the same layer. Or the layer structure of the data lines and the first short-circuit ring may also be a multi-layer structure. In this case, the data lines and the first short-circuit ring may be arranged in different layers.

S105: forming a second electrode (e.g., a second transparent electrode as shown in FIG. 4) on the second insulating layer, in which the second electrode is connected with a data line corresponding to the second electrode through the first via hole and connected with the first electrode via the second via hole.

In the embodiment of the present disclosure, when the first electrode is taken as an interconnection structure for connecting the connection line (e.g., the gate connection line) and the second electrode (e.g., the second transparent electrode), poor contact of signal lines at the via holes for connecting the short-circuit rings on the array substrate can be obviously alleviated. The reasons are as follows: as the connection line is disposed on the first electrode, the contact area between them become large, so that the conductive connection is reliable; as the second via hole is led to the first electrode but not led to the connection line, in the process of forming the second via hole by adoption of large-power plasma for dry etching, the structure reduces or avoids the erosion on the surface of the connection line; and as the second electrode is connected with the first electrode via the second via hole and not directly connected with the connection line, in the process of manufacturing the array substrate, metal at the via holes is not oxidizable, so that the reliability of signal transduction at the via holes for connecting the short-circuit rings on the array substrate can be greatly improved.

For instance, the method provided by at least one embodiment of the present disclosure may further comprise: forming plate electrodes arranged in the same layer as the first electrode in the process of forming the first electrode; and forming slit electrodes arranged in the same layer as the second electrodes in the process of forming the second electrode.

For instance, the method provided by at least one embodiment of the present disclosure may further comprise: forming gate lines arranged in the same layer as the connection line and the second short-circuit ring in the process of forming the connection line and the second short-circuit ring.

For instance, in the method provided by at least one embodiment of the present disclosure, the first electrode, the connection line and the second short-circuit ring may be formed by a half-tone mask patterning process.

For instance, the method provided by at least one embodiment of the present disclosure may further comprise: forming a semiconductor layer on the first insulating layer after forming the first insulating layer. The semiconductor layer may be an active layer of a TFT of a sub-pixel of the array substrate.

For instance, in one embodiment of the present disclosure, the method for manufacturing the array substrate may further comprise: forming plate electrodes arranged in the same layer as the first electrode in the display area of the array substrate in the process of forming the first electrodes; forming gate lines arranged in the same layer as the connection line and the second short-circuit ring in the display area of the array substrate in the process of forming the connection line and the second short-circuit ring; forming a semiconductor layer on the first insulating layer in the display area of the array substrate after forming the first insulating layer; and forming slit electrodes arranged in the same layer as the second electrodes in the display area of the array substrate in the process of forming the second electrodes.

In the embodiment, the step S101 may include: forming the first electrodes, the connection lines and the second short-circuit ring by a half-tone mask patterning process.

For instance, the step S101 may include the following sub-steps: depositing a first conductive film (e.g., a first transparent conductive film for forming the first transparent electrode) and a gate metal layer on the base substrate in sequence by, for instance, physical vapor deposition (PVD); coating one layer of positive photoresist on the base substrate after the above step; performing exposure on the photoresist on the substrate via a mask provided with a fully transparent area, a semi-transparent area and an opaque area, in which photoresist corresponding to the fully transparent area of the mask is fully exposed, photoresist corresponding to the semi-transparent area is partially exposed, and photoresist corresponding to the opaque area is not exposed; performing development process on the exposed photoresist on the substrate after the above step, in which the photoresist at the full exposure area is dissolved and removed, the photoresist at the partial exposure area is partially dissolved and removed, and the photoresist at the non-exposure area is retained and becomes a protection pattern; etching the substrate after the above step, in which the base substrate is exposed after the full exposure area is etched, and a pattern of the first electrode (e.g., the first transparent electrode) is formed, and for instance, a pattern of the plate electrodes arranged in the same layer as the first electrode may also be formed together in this sub-step; performing an ashing process on the residual photoresist on the substrate after the above step, partially removing the residual photoresist at the partial exposure area, exposing the gate metal layer at the partial exposure area, and etching the gate metal layer until the first electrode and the plate electrode are exposed; and stripping off the residual photoresist on the substrate after the above step and exposing the connection line (the connection line formed through the gate metal layer is a gate connection line) and the second short-circuit ring.

In the embodiment of the present disclosure, two conductive layers of the first electrode and the connection line may be formed on the base substrate by one half-tone mask patterning process, so that the manufacturing cost is lowered.

For instance, in the embodiment of the present disclosure, the step S103 may include: forming the semiconductor layer, the data lines and the first short-circuit ring by a half-tone mask patterning process.

For instance, the step S103 may include the following sub-steps: depositing the first insulating layer on the substrate obtained after the step S102 by, for instance, chemical vapor deposition (CVD), depositing a semiconductor layer film by, for instance, CVD as well, and depositing a data metal layer by, for instance, physical vapor deposition (PVD); coating one layer of positive photoresist on the substrate after the above step; performing exposure on the photoresist on the substrate via a mask provided with a fully transparent area, a semi-transparent area and an opaque area, in which photoresist corresponding to the fully transparent area of the mask is fully exposed, photoresist corresponding to the semi-transparent area is partially exposed, and photoresist corresponding to the opaque area is not exposed; performing development on the photoresist on the substrate after the above step, in which the photoresist at the full exposure area is dissolved and removed, the photoresist at the partial exposure area is partially dissolved and removed, and the photoresist at the non-exposure area is retained and becomes a protection pattern; etching the substrate after the above step, in which the first insulating layer is exposed after the full exposure area is etched; performing an ashing process on the residual photoresist on the substrate after the above step, partially removing the residual photoresist at the partial exposure area, exposing a data metal layer at the area, and etching the data metal layer until the semiconductor layer is exposed; and stripping off the residual photoresist on the substrate after the above step and exposing the data line and the first short-circuit ring disposed at the peripheral area of the array substrate.

In the embodiment of the present disclosure, the data lines and the semiconductor layer disposed at the display area of the array substrate may be formed on the first insulating layer by one half-tone mask patterning process, so that the manufacturing cost is lowered.

The structures in the display panel and the method for manufacturing the array substrate, provided by the embodiment of the present disclosure, may refer to the embodiment of the array substrate. No further description will be given here.

Figure 5A:
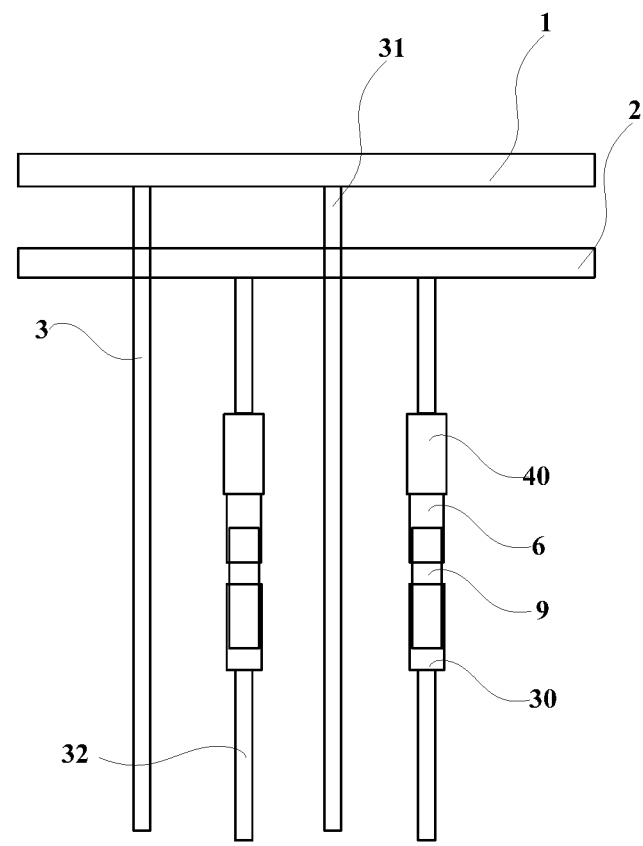
FIG. 5*a* is a schematic structural top view of a peripheral area of the array substrate provided by the embodiment of the present disclosure.
Figure 5B:
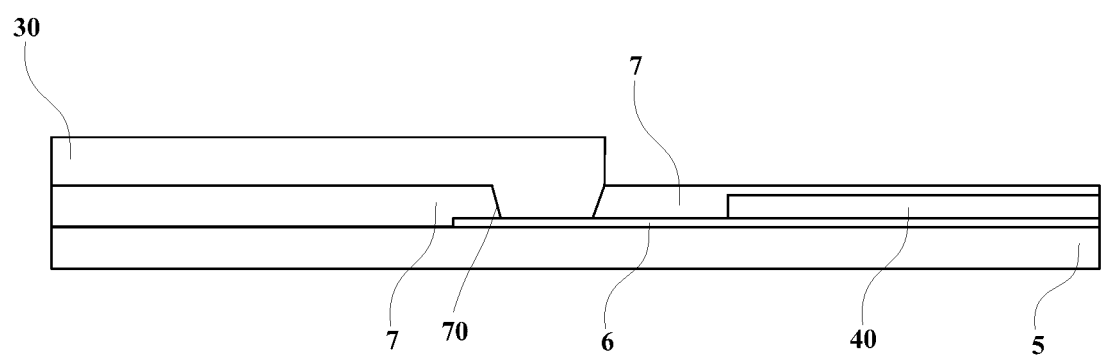
FIG. 5*b* is a schematic structural sectional view of the array substrate provided by the embodiment of the present disclosure.

At least one embodiment of the present disclosure further provides an array substrate. As illustrated in FIGS. 5a and 5b, the array substrate includes a group of data lines 3 and a first short-circuit ring 1 and a second short-circuit ring 2, and the first short-circuit ring 1 and the second short-circuit ring 2 are disposed along a peripheral area of the array substrate. With the group of data lines 3, a first data line 31 of two adjacent data lines 3 is connected with the first short-circuit ring 1, and a second data line 32 of the two adjacent data lines is connected with the second short-circuit ring 2. A connection structure of the second short-circuit ring 2 and the second data line 32 includes: a first electrode 6 disposed on a base substrate 5; a first part 40 to be connected, which is disposed on the first electrode 6 and connected with the first electrode 6; a first insulating layer 7 disposed on the first electrode 6 and the first part 40 to be connected; and a second part 30 to be connected, which is disposed on the first insulating layer 7. The second part 30 to be connected is connected with the first electrode 6 through a via hole 70 in the first insulating layer 7, and one of the first part 40 to be connected and the second part 30 to be connected is the second short-circuit ring 2 and the other is the second data line 32.

For instance, the via hole 70 can expose a part of the surface of the first part 40 to be connected (that is, the bottom of the via hole 70 is opposite to the first part 40 to be connected. In this way, if the first electrode 6 is a transparent electrode and the first part 40 to be connected is made of a conductive material have good conductivity (e.g., a metal material), the reliability of the signal transduction at the vial hole 70 can be obtained while the resistance at the via hole 70 can be reduced also.

Figure 6:
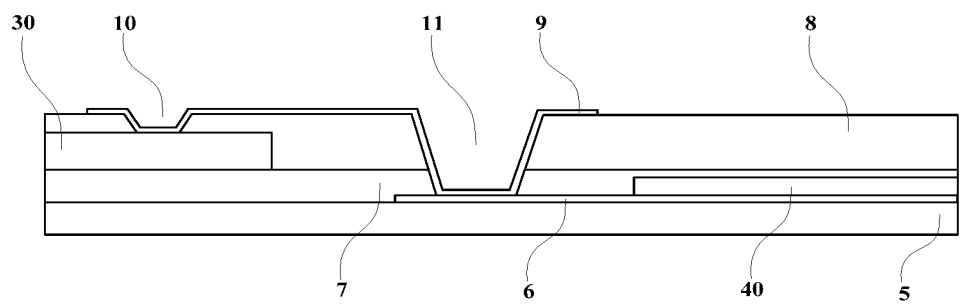
FIG. 6 is another schematic sectional view of the array substrate provided by the embodiment of the present disclosure.

For instance, as illustrated in FIG. 6, the array substrate provided by at least one embodiment of the present disclosure may further comprise: a second insulating layer 8 disposed on the second part 30 to be connected, in which the second insulating layer 8 is provided therein with a first via hole 10 on the second part 30 to be connected, and the first insulating layer 7 and the second insulating layer 8 are provided therein with a second via hole 11 on the first electrode 6; and a second electrode 9 disposed on the second insulating layer 8. The second electrode 9 is connected with the second part 30 to be connected via the first via hole 10 and connected with the first electrode 6 via the second via hole 11.

The structures in the array substrate provided by the embodiment of the present disclosure may refer to relevant description in the embodiment of the array substrate. No further description will be given here.

In the array substrate, the manufacturing method thereof and the display panel, provided by the embodiment of the present disclosure, as the connection line is disposed on the first electrode (e.g., the connection line is in direct contact with the first electrode), the contact area between them becomes large, and hence the conductive connection becomes relatively more reliable; as the second via hole is led to the first electrode (e.g., the first transparent electrode) and not led to the connection line, in the process of forming the second via hole, the influence on the connection line become alleviated; as the second electrode is connected with the first electrode (e.g., the first transparent electrode) via the second via hole and not directly connected with the connection line, in the process of manufacturing the array substrate, the metal at the via hole is not oxidizable, so that the reliability of signal transduction at the via hole for connecting the short-circuit rings on the array substrate can be greatly improved.

What are described above is related to the illustrative embodiments of the disclosure only and not limitative to the scope of the disclosure; the scopes of the disclosure are defined by the accompanying claims.

The present applicant claims the benefits of the Chinese patent application No. 201510309392.4 which was filed on Jun. 5, 2015, and the entire disclosure of this application is incorporated herewith by reference as part of the present application.

What is claimed is:

1. An array substrate, comprising:
   a group of data lines and a group of gate lines which are intercrossed with each other; and
   a first short-circuit ring and a second short-circuit ring which are disposed along a peripheral area of the array substrate,
   wherein two adjacent data lines in the group of data lines are respectively connected with the first short-circuit ring and the second short-circuit ring; and a connection structure between the second short-circuit ring and one corresponding data line comprises:
   a first electrode disposed on a base substrate;
   a connection line disposed on the first electrode;
   a first insulating layer disposed on the first electrode and the connection line, in which the data line connected with the second short-circuit ring is disposed on the first insulating layer;
   a second insulating layer disposed on the data line connected with the second short-circuit ring, in which the second insulating layer is provided with a first via hole on the data line connected with the second short-circuit ring, and the first insulating layer and the second insulating layer are provided with a second via hole on the first electrode; and
   a second electrode disposed on the second insulating layer, in which the second electrode is connected with the data line connected with the second short-circuit ring through the first via hole and connected with the first electrode through the second via hole.

2. The array substrate according to claim 1, wherein the first short-circuit ring and the group of data lines are arranged in the same layer; and/or the second short-circuit ring and the group of gate lines are arranged in the same layer.

3. The array substrate according to claim 1, wherein the first electrode is a first transparent electrode; and/or the second electrode is a second transparent electrode.

4. The array substrate according to claim 1, wherein the connection line is a gate connection line that is disposed in a same layer as the gate lines.

5. The array substrate according to claim 1, wherein the first short-circuit ring is connected with the data lines in odd numbered sequence in the group of the data lines, and the second short-circuit ring is connected with the data lines in even numbered sequence in the group of the data lines; or
   the first short-circuit ring is connected with the data lines in even numbered sequence in the group of the data lines, and the second short-circuit ring is connected with the data lines in odd numbered sequence in the group of the data lines.

6. The array substrate according to claim 1, wherein the array substrate is an advanced super dimension switch (ADS) mode array substrate and comprises a plate electrode and a slit electrode; the first electrode and the plate electrode are arranged in the same layer; and the second transparent electrode and the slit electrode of the array substrate are arranged in the same layer.

7. The array substrate according to claim 1, wherein the connection line is connected with the second short-circuit ring.

8. A display panel, comprising the array substrate according to claim 1.

9. A method for manufacturing an array substrate, comprising:
   forming data lines and a first short-circuit ring on a base substrate, in which the data lines in odd numbered sequence or the data lines in even numbered sequence are connected with the first short-circuit ring;
   forming a first electrode, a connection line and a second short-circuit ring on the base substrate, in which the connection line is disposed on the first electrode and connected with the second short-circuit ring and the first electrode;
   forming a first insulating layer on a layer structure of the connection line and the second short-circuit ring, in which the data lines and the first short-circuit ring are formed on the first insulating layer;
   forming a second insulating layer on a layer structure of the data lines and the first short-circuit ring, in which the second insulating layer is provided with a first via hole on the data line not connected with the first short-circuit ring, and the first insulating layer and the second insulating layer are provided with a second via hole on the first electrode; and
   forming a second electrode on the second insulating layer, in which the second electrode is connected with one corresponding data line through the first via hole and connected with the first electrode through the second via hole.

10. The method according to claim 9, wherein the connection line is lapped over an upper surface of the first electrode.

11. The method according to claim 9, wherein the first electrode is a first transparent electrode; and/or the second electrode is a second transparent electrode.

12. The method according to claim 9, wherein the connection line is a gate connection line.

13. The method according to claim 9, further comprising:
   forming plate electrodes arranged in the same layer as the first electrode in the process of forming the first electrode; and forming slit electrodes arranged in the same layer as the second electrode in the process of forming the second electrode.

14. The method according to claim 9, further comprising:
forming gate lines arranged in the same layer as the connection line and the second short-circuit ring in the process of forming the connection line and the second short-circuit ring.

15. The method according to claim 9, wherein
the first electrode, the connection line and the second short-circuit ring are formed by a half-tone mask patterning process.

16. The method according to claim 9, further comprising:
forming a semiconductor layer on the first insulating layer after forming the first insulating layer.

17. The method according to claim 9, further comprising:
forming plate electrodes arranged in the same layer as the first electrode in the process of forming the first electrode;
forming gate lines arranged in the same layer as the connection line and the second short-circuit ring in the process of forming the connection line and the second short-circuit ring;
forming a semiconductor layer on the first insulating layer after forming the first insulating layer; and
forming slit electrodes arranged in the same layer as the second electrode in the process of forming the second electrode.

18. The method according to claim 9, wherein
the first electrode, the connection line and the second short-circuit ring are formed by a half-tone mask patterning process.

19. The method according to claim 9, wherein
the semiconductor layer, the data lines and the first short-circuit ring are formed by a half-tone mask patterning process.

20. An array substrate, comprising:
a group of data lines; and
a first short-circuit ring and a second short-circuit ring which are disposed along a peripheral area of the array substrate,
wherein in the group of data lines, the first data line in two adjacent data lines is connected with the first short-circuit ring, and the second data line in the two adjacent data lines is connected with the second short-circuit ring; and a connection structure of the second short-circuit ring and the second data line comprises:
a first electrode disposed on a base substrate;
a first part to be connected disposed on the first electrode and connected with the first electrode;
a first insulating layer disposed on the first electrode and the first part to be connected; and
a second part to be connected disposed on the first insulating layer, in which the second part to be connected is connected with the first electrode via a via hole in the first insulating layer, and one of the first part to be connected and the second part to be connected is the second short-circuit ring and the other is the second data line.

* * * * *